(12) United States Patent
Rumpler et al.

(10) Patent No.: US 10,979,044 B2
(45) Date of Patent: Apr. 13, 2021

(54) CHIP RESET VIA COMMUNICATION INTERFACE TERMINALS

(71) Applicant: Infineon Technologies AG, Neubiberg (DE)

(72) Inventors: Christoph Rumpler, Munich (DE); Achim Dallmann, Baldham (DE)

(73) Assignee: Infineon Technologies AG, Neubiberg (DE)

( * ) Notice: Subject to any disclaimer, the term of this patent is extended or adjusted under 35 U.S.C. 154(b) by 111 days.

(21) Appl. No.: 16/353,431

(22) Filed: Mar. 14, 2019

(65) Prior Publication Data

US 2020/0295752 A1    Sep. 17, 2020

(51) Int. Cl.

| G06F 9/00 | (2006.01) |
| H03K 17/22 | (2006.01) |
| G06F 9/4401 | (2018.01) |
| H03K 19/20 | (2006.01) |

(52) U.S. Cl.
CPC ........... *H03K 17/22* (2013.01); *G06F 9/4401* (2013.01); *G06F 9/4416* (2013.01); *H03K 19/20* (2013.01)

(58) Field of Classification Search
CPC ....... H03K 17/22; H03K 19/20; G06F 9/4401
USPC ........................................................... 713/2
See application file for complete search history.

(56) References Cited

U.S. PATENT DOCUMENTS

| 5,974,561 A | 10/1999 | Kardach et al. | |
| 2002/0133795 A1* | 9/2002 | Yamada | G01R 31/31926 714/731 |
| 2003/0233499 A1* | 12/2003 | Choi | G06F 13/387 710/36 |
| 2004/0008725 A1* | 1/2004 | McNamara | G06F 13/4291 370/466 |
| 2004/0017112 A1* | 1/2004 | Kim | H02M 1/36 307/31 |
| 2008/0013396 A1* | 1/2008 | Choi | G06K 19/077 365/226 |
| 2008/0191674 A1* | 8/2008 | Cheng | H02M 3/156 323/282 |
| 2013/0179619 A1* | 7/2013 | Whetsel | G06F 13/4022 710/305 |
| 2014/0075072 A1* | 3/2014 | Alley | G06F 13/4291 710/110 |
| 2014/0351611 A1* | 11/2014 | Kim | G06F 13/4081 713/310 |

(Continued)

OTHER PUBLICATIONS

Booth, J.A. et al., "Serial Wire Debug-Ideal for Microcontrollers", Texas Instruments, Sep. 4, 2010, 9 pages.

*Primary Examiner* — Volvick Derose
(74) *Attorney, Agent, or Firm* — Slater Matsil, LLP (57) ABSTRACT

In an embodiment, an integrated circuit includes a communication interface configured to be coupled to a communication bus and an input circuit. The communication interface has a plurality of terminals. The input circuit has a first input coupled to a first terminal of the plurality of terminals, and a second input coupled to a second terminal of the plurality of terminals. The first input of the input circuit is configured to receive a first signal and the second input of the input circuit is configured to receive a second signal. The input circuit is configured to generate a reset signal at an output of the input circuit based on the first and second signals while the communication interface is unselected.

22 Claims, 3 Drawing Sheets

(56) References Cited

U.S. PATENT DOCUMENTS

| | | | |
|---|---|---|---|
| 2014/0351653 A1* | 11/2014 | Hook | G11C 29/48 |
| | | | 714/42 |
| 2015/0058544 A1* | 2/2015 | Yeh | G06F 9/30043 |
| | | | 711/103 |
| 2015/0363353 A1* | 12/2015 | Enami | G06F 13/364 |
| | | | 710/110 |
| 2016/0349326 A1 | 12/2016 | Grafton et al. | |
| 2017/0185548 A1 | 6/2017 | Sakuma | |
| 2018/0276157 A1* | 9/2018 | Lofamia | G06F 13/4282 |

* cited by examiner

PRIOR ART

CHIP RESET VIA COMMUNICATION INTERFACE TERMINALS

TECHNICAL FIELD

The present disclosure relates generally to an electronic system and method, and, in particular embodiments, to a chip reset via communication interface terminals.

BACKGROUND

Generally, a circuit, such as a system on chip (SoC) or an application-specific integrated circuit (ASIC), has a supply voltage range in which it operates properly. If the system begins operating when the supply voltage is below the operating range, the system may malfunction. For example, a power management integrated circuit (PMIC) may have an operating supply voltage range from 3 V to 5.5 V. Beginning operation of such PMIC at, e.g., 2 V, may cause such PMIC to startup in an unknown state.

Figure 1:
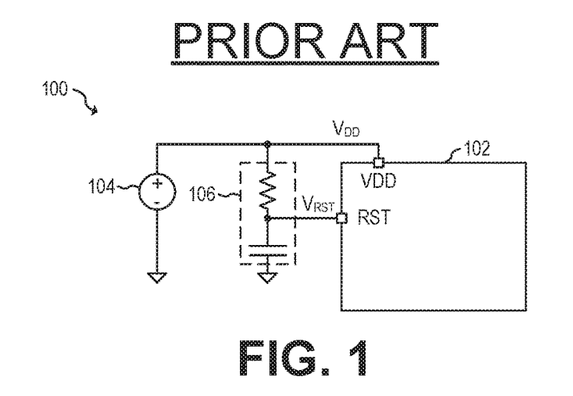
FIG. 1 shows an IC that receives a reset signal to place the IC in a known state after startup.

Circuits generally use a reset signal to bring the system to a defined state during startup. For example, FIG. 1 shows integrated circuit (IC) 102 receiving a reset signal to place IC 102 in a known state after startup. As shown in FIG. 1, RC circuit 106 is used to keep reset voltage $V_{RST}$ low while the supply voltage $V_{DD}$ increases. IC 102 is off while the voltage $V_{RST}$ is low. When the reset voltage $V_{RST}$ increases above a threshold, then IC 102 turns on. RC circuit 106 is designed such that when the reset voltage $V_{RST}$ increases above the threshold, supply voltage VDD is inside the operating voltage supply range of IC 102.

Instead of using a dedicated reset terminal (e.g., pin or pad), some ICs include a power-on reset (POR) to detect that power has been applied to the IC. After detecting that power has been applied, the POR circuit internally generates a reset signal that places the IC in a known state.

SUMMARY

In accordance with an embodiment, an integrated circuit includes a communication interface configured to be coupled to a communication bus and an input circuit. The communication interface has a plurality of terminals. The input circuit has a first input coupled to a first terminal of the plurality of terminals, and a second input coupled to a second terminal of the plurality of terminals. The first input of the input circuit is configured to receive a first signal and the second input of the input circuit is configured to receive a second signal. The input circuit is configured to generate a reset signal at an output of the input circuit based on the first and second signals while the communication interface is unselected.

In accordance with an embodiment, an integrated circuit includes a serial peripheral interface (SPI) interface configured to be coupled to an SPI communication bus, and an input circuit. The SPI interface has an SPI clock terminal, a chip select terminal and a plurality of data terminals. The input circuit has a first input coupled to the SPI clock terminal of the plurality of data terminals, and a second input coupled to one of the plurality of data terminals of the plurality of data terminals. The first input of the input circuit is configured to receive a first signal and the second input of the input circuit is configured to receive a second signal. The input circuit is configured to generate a reset signal at an output of the input circuit based on the first and second signals while the SPI interface is inactive.

In accordance to an embodiment, a method of resetting an integrated circuit includes receiving a first signal via a first terminal of the integrated circuit, the first terminal coupled between a communication bus and a communication interface; receiving a second signal via a second terminal of the integrated circuit, the second terminal coupled between the communication bus and the communication interface; causing a reset signal to be in a first state of the reset signal when the first signal is in a first state of the first signal; causing the reset signal to be in the first state of the reset signal when a second signal is in a first state of the second signal; causing the reset signal to be in a second state of the reset signal when the first signal is in a second state of the first signal for at least a first duration and the second signal is in a second state of the second signal, where the first state of the first signal is opposite the second state of the first signal, where the first state of the second signal is opposite the second state of the second signal, and where the first state of the reset signal is opposite the second state of the reset signal; and resetting the integrated circuit to a known state when the reset signal is in the third state.

BRIEF DESCRIPTION OF THE DRAWINGS

For a more complete understanding of the present invention, and the advantages thereof, reference is now made to the following descriptions taken in conjunction with the accompanying drawings, in which.

Corresponding numerals and symbols in different figures generally refer to corresponding parts unless otherwise indicated. The figures are drawn to clearly illustrate the relevant aspects of the preferred embodiments and are not necessarily drawn to scale.

DETAILED DESCRIPTION OF ILLUSTRATIVE EMBODIMENTS

The making and using of the embodiments disclosed are discussed in detail below. It should be appreciated, however, that the present invention provides many applicable inventive concepts that can be embodied in a wide variety of specific contexts. The specific embodiments discussed are merely illustrative of specific ways to make and use the invention, and do not limit the scope of the invention.

The description below illustrates the various specific details to provide an in-depth understanding of several example embodiments according to the description. The embodiments may be obtained without one or more of the specific details, or with other methods, components, materials and the like. In other cases, known structures, materials or operations are not shown or described in detail so as not to obscure the different aspects of the embodiments. References to "an embodiment" in this description indicate that a particular configuration, structure or feature described in relation to the embodiment is included in at least one embodiment. Consequently, phrases such as "in one embodiment" that may appear at different points of the present description do not necessarily refer exactly to the same embodiment. Furthermore, specific formations, structures or features may be combined in any appropriate manner in one or more embodiments.

Embodiments of the present invention will be described in specific contexts, such as a chip reset using SPI terminals or SWD terminals. Embodiments of the present invention may be used with other communication protocols, such as joint test action group (JTAG), or other serial or parallel communication protocols, for example.

In an embodiment of the present invention, an IC is capable of being reset to a known state via SPI terminals. By resetting the IC by reusing SPI terminals, an internal POR circuit and a dedicated reset terminal may advantageously be avoided. By avoiding an internal POR circuit, some embodiments may advantageously reduce the die area, which may result in lower costs per die. By avoiding a dedicated reset terminal, some embodiments may advantageously reduce the package size (e.g., because of lower pin count), which may result in lower package costs.

Figure 2:
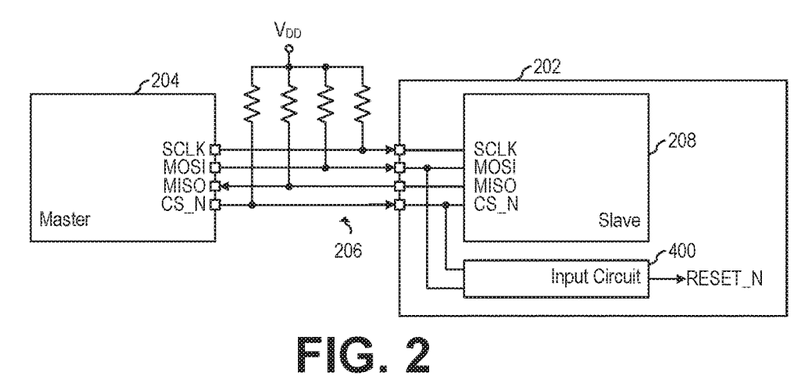
FIG. 2 shows a schematic diagram of an IC having a chip reset by reusing terminals of a serial peripheral interface (SPI) interface, according to an embodiment of the present invention.

FIG. 2 shows a schematic diagram of IC 202 having a chip reset by reusing terminals of a communication interface, such as an SPI interface, according to an embodiment of the present invention. As shown in FIG. 2, IC 202 includes SPI slave 208, which forms the communication interface of IC 202, and input circuit 400. SPI slave 208 includes chip select terminal CS_N configured to receive signal $V_{CS\_N}$ via which selection and unselection of the SPI slave 208 is carried out, a master-out-slave-in (MOSI) terminal MOSI configured to receive signal $V_{MOSI}$ via which data is received by SPI slave 208, a master-in-slave-out (MISO) terminal MISO configured to generate signal $V_{MISO}$ via which data is sent by SPI slave 208, and a clock terminal SCLK configured to receive signal $V_{SCLK}$, which serves as a clock signal for SPI bus 206. Input circuit 400 is configured to receive first and second signals, which may correspond to signals $V_{CS\_N}$ and $V_{MOSI}$, respectively. As shown in FIG. 2, IC 202 includes terminals SCLK, MISO, MOSI and CS_N that corresponds to terminals SCLK, MISO, MOSI and CS_N of SPI slave 208.

During normal operation, SPI master 204 may initiate SPI communication with IC 202 via SPI bus 206 and IC 202 may communicate with SPI master 204 via SPI bus 206 using SPI slave 208. For example, SPI master 204 may assert (i.e., set in its active state) terminal CS_N to select SPI slave 208 to communicate with SPI slave 208 and deassert (i.e., set in its inactive state) terminal CS_N to unselect SPI slave 208 such that SPI slave 208 ignores the communication from SPI bus 206. For example, SPI master 204 may assert CS_N terminal by transitioning signal $V_{CS\_N}$ from high to low and may deassert CS_N terminal by transitioning signal $V_{CS\_N}$ from low to high.

When SPI slave 208 is selected, SPI master 204 generates a clock signal at terminal SCLK at a frequency supported by SPI and sends data to SPI slave 208 via terminal MOSI. SPI slave 208 then processes data transferred from SPI master 204 with signal $V_{MOSI}$ via terminal MOSI (e.g., in case a of write command, write the specified register in a register map of IC 202). If applicable (e.g., when SPI slave 208 receives a read command), SPI slave 208 sends data back to SPI master 204 with signal $V_{MISO}$ via terminal MISO. When terminal CS_N is deasserted (e.g., such as when signal $V_{CS\_N}$ is high), SPI slave 208 is unselected. When SPI slave 208 is unselected, SPI slave 208 ignores (i.e., does not process) data from SPI bus 206 (e.g., ignores the toggling of signals $V_{SCLK}$ and $V_{MOSI}$ at terminals SCLK and MOSI).

SPI master 204 may be, for example, a microcontroller, processor, digital signal processor (DSP), ASIC, or other device having an SPI master interface. IC 202 may be a PMIC, ASIC, driver, radar circuit, or any other device having an SPI slave interface.

SPI slave 208 may be implemented in any way known in the art. In some embodiments, SPI slave 208 supports SPI frequencies higher than 1 MHz, such as 10 MHz, 50 MHz, or higher. Frequencies lower than 1 MHz may also be supported by SPI slave 208.

In an embodiment of the present invention, the chip select terminal and the master-out-slave-in terminal of an SPI communication bus are used to reset an IC to place the IC in a known state. The reset may be issued after power-up (e.g., immediately after power is applied to the IC), or at any time during operation. In an embodiment, when the chip select terminal is deasserted (e.g., high), asserting the master-out-slave-in terminal (e.g., high) causes the IC to reset to a known state.

In some embodiments, the known state of the IC may be a predetermined state, e.g., as defined by default values of a register map of the IC. For example, bits on a register map the IC may configure one or more analog or digital blocks. By resetting the register map to default values and providing such default values to the one or more analog or digital blocks, the IC may be placed in known state.

Figure 3:
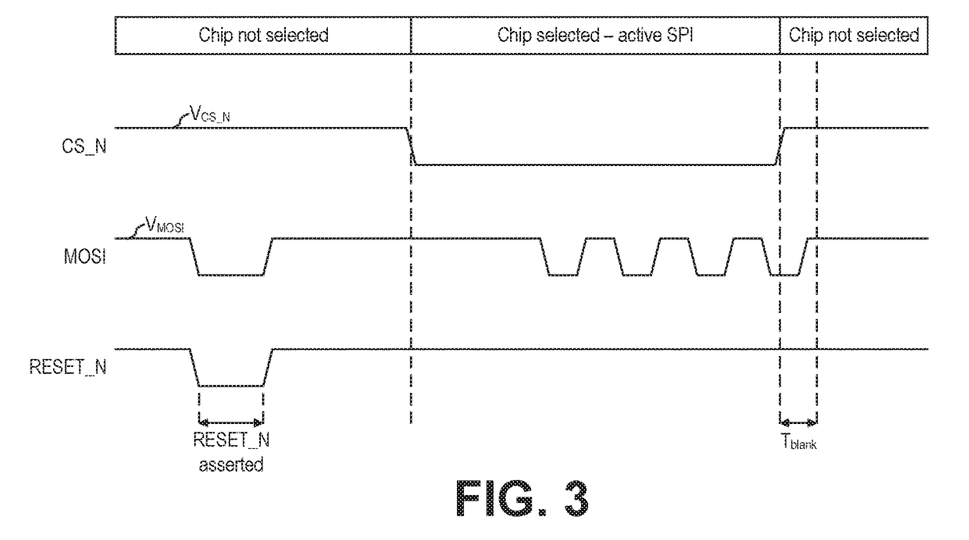
FIG. 3 shows a waveform diagram illustrating SPI signals of SPI terminals of the IC of FIG. 2, according to an embodiment.

FIG. 3 shows a waveform diagram illustrating SPI signals of SPI terminals of IC 202, according to an embodiment. As shown in FIG. 3, when terminal CS_N is deasserted (e.g., high), transitioning terminal MOSI to a low state causes an internal reset signal RESET_N to be asserted (e.g., low). Asserting the internal reset signal RESET_N causes IC 202 to be placed in a known state.

When terminal CS_N is asserted, active SPI communication may be ongoing between SPI master 204 and SPI slave 208, and transitioning terminal MOSI to a low state does not change the state of the internal reset signal RESET_N. Changes in the state of terminal MOSI also do not cause a change in the state of the internal reset signal RESET_N during a blanking time $T_{blank}$ after deasserting terminal CS_N.

In some embodiments, blanking time $T_{blank}$ may be between 4 ns and 10 ns. In some embodiments, blanking time $T_{blank}$ may be higher than 10 ns, or lower than 4 ns. In some embodiments, blanking time $T_{blank}$ may be at least as long, or longer, than half a period of the frequency of the communication bus, such as half a period of a clock signal at terminal SCLK.

Although the internal reset signal RESET_N is illustrated as an active low signal (i.e., asserted when low and deasserted when high), some embodiments may use a reset signal that is active high (i.e., asserted when high and deasserted when low).

Advantages of some embodiments include the capability of asynchronously resetting an IC to place it in a known state without using a dedicated reset terminal and without using a POR circuit that is internal to the IC.

Figure 4:
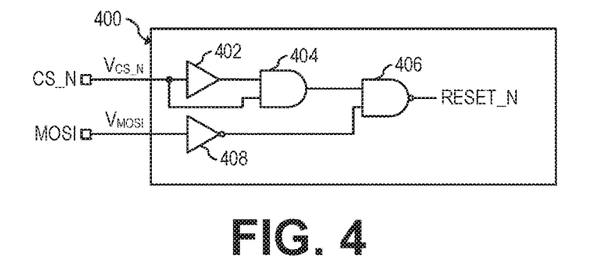
FIG. 4 shows a schematic diagram of an input circuit for generating an internal reset signal based on SPI terminals, according to an embodiment of the present invention.

FIG. 4 shows a schematic diagram of input circuit 400 for generating the internal reset signal RESET_N based on SPI terminals, according to an embodiment of the present invention. Input circuit 400 includes delay circuit 402, AND gate 404, NAND gate 406, and inverter 408.

During normal operation, when signal $V_{CS\_N}$ is low, the output of AND gate 404 is low, which causes reset signal RESET_N at the output of NAND gate 406 to be high, irrespective of the state of signal $V_{MOSI}$. When signal $V_{CS\_N}$ transitions from low to high, the output of delay circuit 402 remains low for blanking time $T_{blank}$, which causes the output of AND gate 404 to be low, which causes reset signal RESET_N at the output of NAND gate 406 to be high during the blanking time $T_{blank}$, irrespective of the state of signal $V_{MOSI}$. After signal $V_{CS\_N}$ is high for a time longer than a blanking time $T_{blank}$, the output of AND gate 404 is high, which causes reset signal RESET_N at the output of NAND gate 406 to be the equal to signal $V_{MOSI}$. In such state, when signal $V_{MOSI}$ is high, the reset signal RESET_N is high (deasserted), and when signal $V_{MOSI}$ terminal is low, the reset signal RESET_N is low (asserted).

Input circuit 400 is enabled by default when power is applied to IC 202. In some embodiments, input circuit may be disabled during normal operation, e.g., when IC 202 goes to a low power mode. In some embodiments, IC 202 includes additional circuits (not shown), such as an input driver coupled between the chip select terminal CS_N of IC 202 and delay circuit 402, and an input driver coupled between MOSI terminal of IC 202 and AND gate 406, for example. In such embodiments, such input drivers may be enabled by default.

Delay circuit 402 may be implemented, for example, as a plurality of inverters connected in series. Other implementations are also possible.

Figure 5:
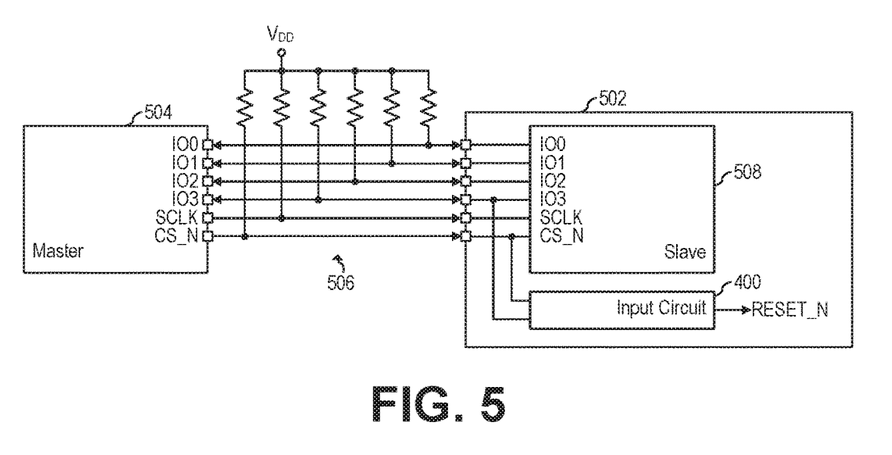
FIG. 5 shows a schematic diagram of an IC having a chip reset by reusing terminals of a quad SPI interface, according to an embodiment of the present invention.

As shown, e.g., in FIG. 2, IC 202 may be reset by reusing two terminals of a single SPI communication interface. In some embodiments, an IC may include a multi-I/O SPI interface, such as a dual SPI interface, quad SPI interface, or octo SPI interface. In such embodiments, two terminals of such multi-I/O SPI interface may be used to reset the IC to place it in a known state. For example, FIG. 5 shows a schematic diagram of IC 502, according to an embodiment of the present invention. IC 502 includes quad SPI slave 508. Quad SPI slave 508 includes chip select terminal CS_N configured to receive signal $V_{CS\_N}$, a input/output terminals IO0, IO1, IO2 and IO3 configured to receive and transmit signals $V_{IO0}$, $V_{IO1}$, $V_{IO2}$, and $V_{IO3}$, and a clock terminal SCLK configured to receive signal $V_{SCLK}$. As shown in FIG. 5, IC 502 includes terminals SCLK, IO0, IO1, IO2, IO3 and CS_N that corresponds to terminals SCLK, IO0, IO1, IO2, IO3 and CS_N of quad SPI slave 508.

Quad SPI communication bus 506 may have up to 4 times the data bandwidth as a single SPI communication bus 206 when operating at the same SPI clock frequency. By coupling input circuit 400 to chip select terminal CS_N and I/O terminal IO3, for example, IC 502 may be reset in a similar manner as IC 202. In some embodiments, another I/O terminal, such as IO2, IO1, or IO0, may be coupled to input circuit 400 used instead of IO3.

Figure 6:
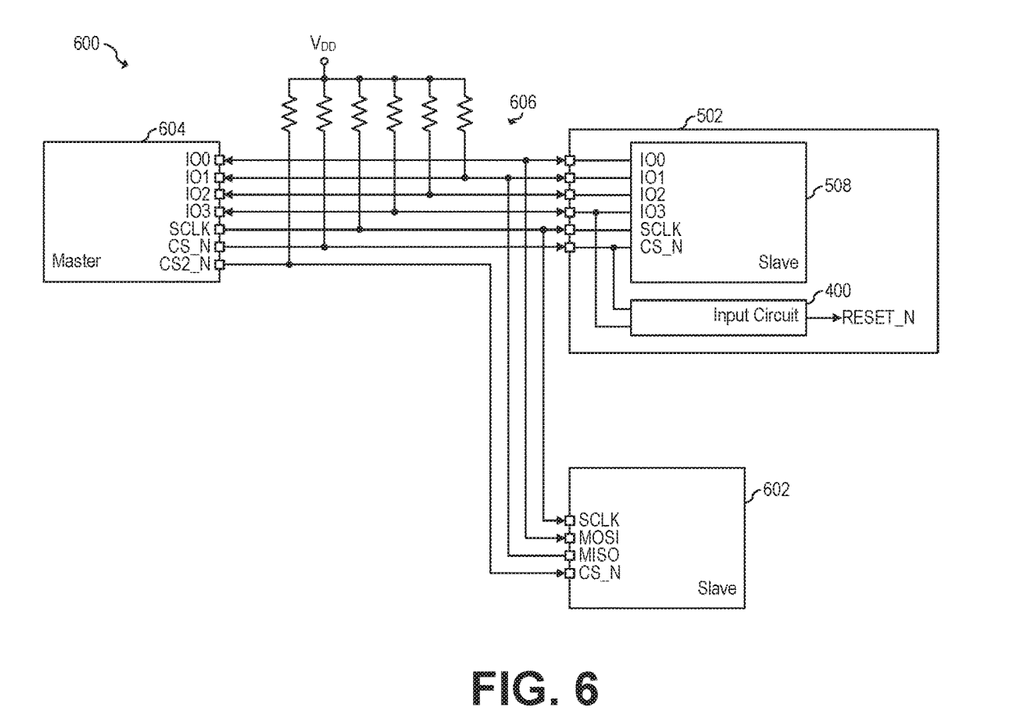
FIG. 6 shows a schematic diagram of a system having the IC of FIG. 5, and having at least one more IC coupled to SPI an SPI communication bus, according to an embodiment of the present invention.

In some embodiments, one or more ICs having, e.g., a single SPI interface may be coupled to SPI communication bus 506 without interfering with the reset operation of IC 502. For example, FIG. 6 shows a schematic diagram of system 600 having IC 502, and having at least one more SPI slave 602 coupled to SPI communication bus 606, according to an embodiment of the present invention. SPI slave 602 may operate in a similar manner as SPI slave 208.

As shown in FIG. 6, when quad SPI slave 508 is not selected (CS_N deasserted), SPI slave 602 may be selected (CS2_N asserted), and SPI master 604 may communicate with SPI slave 602 via SPI communication bus 606 (e.g., using terminals IO0 as master-out-slave-in terminal and IO1 as master-in-slave-out terminal). During communication between SPI slave 602 and SPI master 604, IC 502 may not be accidentally reset since terminal IO3 is not being used in such communication (i.e., terminal IO3 is not switching during the communication between SPI master 604 and SPI slave 602 via SPI communication bus 606).

Although a single SPI slave 602 is shown coupled to SPI communication bus 606 in FIG. 6, in some embodiments more than one SPI slave may be coupled to SPI communication bus 606.

It is understood that an IC having another multi-I/O SPI interface, such as an octo SPI interface, may be implemented in a similar manner as IC 502 in system 600.

Figure 7:
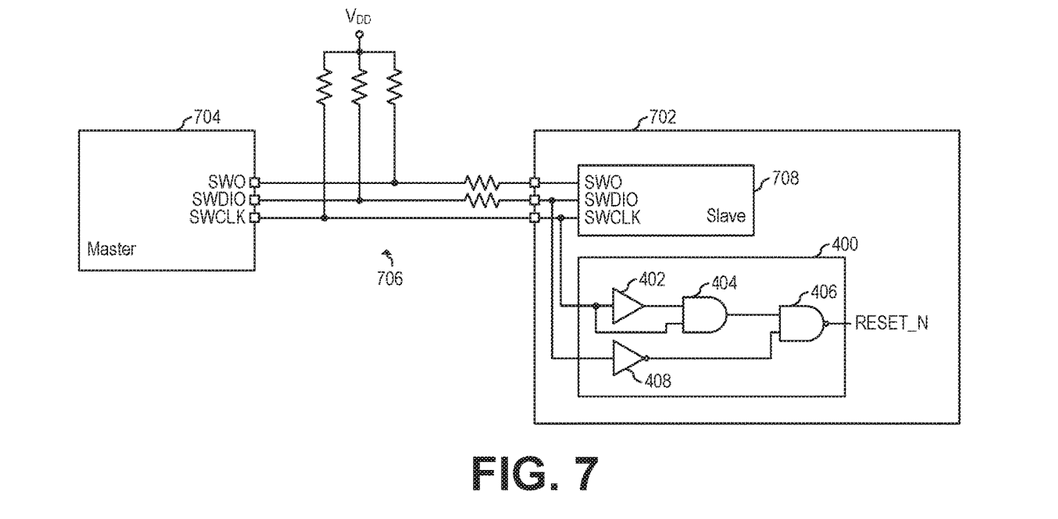
FIG. 7 shows a schematic diagram of an IC having a chip reset by reusing terminals of a serial wire debug (SWD) interface, according to an embodiment of the present invention.

It is understood that the mechanism to reset an IC by reusing terminals of a communication interface is not limited to SPI, but may be extended to other communication protocols in which two terminals may be reused. For example, FIG. 7 shows a schematic diagram of IC 702 having a chip reset by reusing terminals of a SWD (Serial Wire Debug) interface, according to an embodiment of the present invention. As shown in FIG. 7, IC 702 includes SWD interface 708. SWD interface 708 includes input clock terminal SWCLK, data in and out terminal SWDIO and serial wire output terminal SWO.

A reset signal may be generated inside IC 702 without using a dedicated reset terminal by using an input circuit, such as input circuit 400, as shown in FIG. 7. In some embodiments, delay circuit 402 may cause a delay of at least a time equal to when SWCLK signal is high (e.g., half a period of SWCLK signal), or longer. Toggling SWCLK during normal debug, therefore, does not cause the internal reset signal RESET_N to be asserted. To cause a reset, SWCLK is asserted (e.g., high), and SWDIO is asserted for at least a period equal to blanking time $T_{blank}$.

SWD is a bidirectional protocol that is generally used for debugging purposes. SWCLK terminal is configured to receive a clock signal $V_{SWCLK}$. SWDIO terminal is used to receive and send data by using signal $V_{SWDIO}$. SWO terminal is configured to generate signal $V_{SWO}$ to aid in debug tracing. SWD interface 708 may be implemented in any way known in the art.

Figure 8:
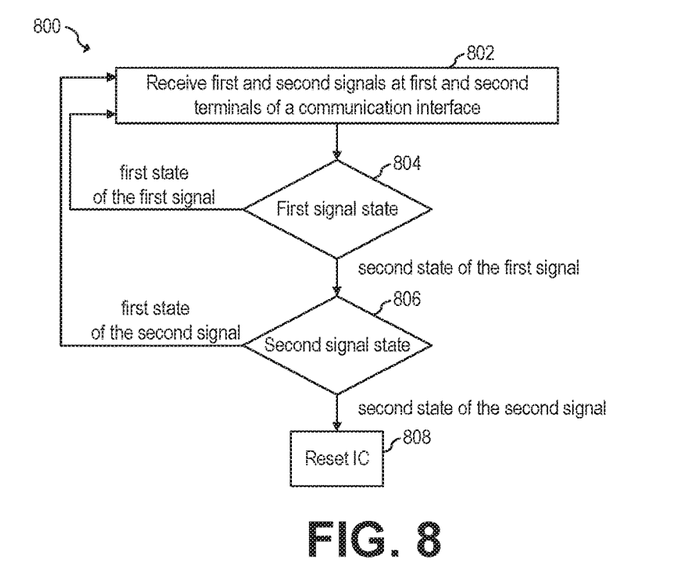
FIG. 8 shows a flowchart of an embodiment method for resetting an integrated circuit, according to an embodiment of the present invention.

FIG. 8 shows a flowchart of embodiment method 800 for resetting an integrated circuit, according to an embodiment of the present invention. Method 800 may be implemented, for example, by an IC coupled to an SPI communication bus, such as ICs 202 and 502. Method 800 may also be implemented by ICs coupled to other types of communication bus, such as IC 702, for example.

During step 802, an IC receives first and second signals via first and second terminals of the IC, the first and second terminals of the IC being coupled to first and second terminals of a communication interface of the IC. In some embodiments, the communication interface may be an SPI slave, such as SPI slave 208. In such embodiments, the first and second signals may correspond to signals $V_{CS\_N}$ and $V_{MOSI}$, respectively, and the first and the second terminals may correspond to the chip select terminal CS_N and the master-out-slave-in terminal MOSI, respectively. In other embodiments, the communication interface may be a multi-IO SPI interface, such as SPI slave 508. In yet other embodiments, the communication interface may be an SWD interface, such as SWD interface 708. Other communication interfaces may be used.

During step 804, a circuit, such as input circuit 400 determines the state of the first signal. If the first signal is in a first state of the first signal (e.g., low), the IC returns to step 802. If the first signal is in a second state of the first signal (e.g., high), the input circuit determines the state of the second signal during step 806.

If the second signal is in a first state of the second signal (e.g., high), the IC returns to step 802. If the second signal is in a second state of the second signal (e.g., low), the IC is reset to a known state during step 808. In some embodiment, the IC is reset when the input circuit asserts a reset signal, such as RESET_N (e.g., transitioning the reset signal from a first state of the reset signal, such as high, to a second state of the reset signal, such as low).

Example embodiments of the present invention are summarized here. Other embodiments can also be understood from the entirety of the specification and the claims filed herein.

EXAMPLE 1

An integrated circuit including: a communication interface configured to be coupled to a communication bus, the communication interface having a plurality of terminals; and an input circuit having a first input coupled to a first terminal of the plurality of terminals, and a second input coupled to a second terminal of the plurality of terminals, the first input of the input circuit configured to receive a first signal and the second input of the input circuit configured to receive a second signal, where the input circuit is configured to generate a reset signal at an output of the input circuit based on the first and second signals while the communication interface is unselected.

EXAMPLE 2

The integrated circuit of example 1, where the input circuit is configured to: cause the reset signal to be in a first state of the reset signal when the first signal is in a first state of the first signal; cause the reset signal to be in the first state of the reset signal when a second signal is in a first state of the second signal; and cause the reset signal to be in a second state of the reset signal when the first signal is in a second state of the first signal for at least a first duration and the second signal is in a second state of the second signal, where the first state of the first signal is opposite the second state of the first signal, where the first state of the second signal is opposite the second state of the second signal, and where the first state of the reset signal is opposite the second state of the reset signal.

EXAMPLE 3

The integrated circuit of one of examples 1 or 2, where the first state of the first signal is high, the second state of the first signal is low, the first state of the second signal is high, the second state of the second signal is low, the first state of the reset signal is high, and the second state of the reset signal is low.

EXAMPLE 4

The integrated circuit of one of examples 1 to 3, where the input circuit includes: a delay circuit having an input coupled to the first input of the input circuit; an AND gate having a first input coupled to an output of the delay circuit and a second input coupled to the first input of the input circuit; an inverter having an input coupled to the second input of the input circuit; and a NAND gate having a first input coupled to an output of the AND gate, a second input coupled to an output of the inverter, and an output coupled to the output of the input circuit.

EXAMPLE 5

The integrated circuit of one of examples 1 to 4, where the first duration is longer than 4 ns.

EXAMPLE 6

The integrated circuit of one of examples 1 to 5, where the first duration is about 10 ns.

EXAMPLE 7

The integrated circuit of one of examples 1 to 6, where the communication interface is configured to be selectable based on the first signal.

EXAMPLE 8

The integrated circuit of one of examples 1 to 7, where the communication interface is configured to: be selected when the first signal is low; and not be selected when the first signal is high.

EXAMPLE 9

The integrated circuit of one of examples 1 to 8, where the communication interface is a serial peripheral interface (SPI) interface.

EXAMPLE 10

The integrated circuit of one of examples 1 to 9, where the SPI interface is a single SPI interface having a chip select terminal, a master-in-slave-out terminal, a master-out-slave-in terminal and an SPI clock terminal, and where the first input of the input circuit is coupled to the chip select terminal and the second input of the input circuit is coupled to the master out slave in terminal.

EXAMPLE 11

The integrated circuit of one of examples 1 to 10, where the SPI interface is a multi-IO SPI interface having a chip select terminal, an SPI clock terminal, and a plurality of input output terminals and where the first input of the input circuit is coupled to the chip select terminal and the second input of the input circuit is coupled to one of the plurality of input output terminals.

EXAMPLE 12

The integrated circuit of one of examples 1 to 11, where the communication interface is a serial wire debug (SWD) interface.

EXAMPLE 13

The integrated circuit of one of examples 1 to 12, where the first input of the input circuit is coupled to an input clock terminal of the SWD interface and the second input of the input circuit is coupled to data in and out terminal of the SWD interface.

EXAMPLE 14

The integrated circuit of one of examples 1 to 13, where the first signal is a periodic signal, and where the input circuit includes a delay circuit coupled to the first input of the input circuit, the delay circuit configured to generate a delay equal to or higher than half a period of the periodic signal.

EXAMPLE 15

An integrated circuit including: a serial peripheral interface (SPI) interface configured to be coupled to an SPI communication bus, the SPI interface having an SPI clock terminal, a chip select terminal and a plurality of data terminals; and an input circuit having a first input coupled to the SPI clock terminal of the plurality of data terminals, and a second input coupled to one of the plurality of data terminals of the plurality of data terminals, the first input of the input circuit configured to receive a first signal and the second input of the input circuit configured to receive a second signal, where the input circuit is configured to generate a reset signal at an output of the input circuit based on the first and second signals while the SPI interface is inactive.

EXAMPLE 16

The integrated circuit of example 15, where the input circuit is configured to: cause the reset signal to be in a first state of the reset signal when the first signal is in a first state of the first signal; cause the reset signal to be in the first state of the reset signal when a second signal is in a first state of the second signal; and cause the reset signal to be in a second state of the reset signal when the first signal is in a second state of the first signal for at least a first duration and the second signal is in a second state of the second signal, where the first state of the first signal is opposite the second state of the first signal, where the first state of the second signal is opposite the second state of the second signal, and where the first state of the reset signal is opposite the second state of the reset signal.

EXAMPLE 17

The integrated circuit of one of examples 15 or 16, where the first state of the first signal is high, the second state of the first signal is low, the first state of the second signal is high, the second state of the second signal is low, the first state of the reset signal is high, and the second state of the reset signal is low.

EXAMPLE 18

The integrated circuit of one of examples 15 to 17, where the input circuit includes: a delay circuit having an input coupled to the first input of the input circuit; an AND gate having a first input coupled to an output of the delay circuit and a second input coupled to the first input of the input circuit; an inverter having an input coupled to the second input of the input circuit; and a NAND gate having a first input coupled to an output of the AND gate, a second input coupled to an output of the inverter, and an output coupled to the output of the input circuit.

EXAMPLE 19

The integrated circuit of one of examples 15 to 18, where the SPI interface includes a single SPI interface.

EXAMPLE 20

The integrated circuit of one of examples 15 to 19, where the SPI interface is a quad SPI interface.

EXAMPLE 21

A method of resetting an integrated circuit, the method including: receiving a first signal via a first terminal of the integrated circuit, the first terminal coupled between a communication bus and a communication interface; receiving a second signal via a second terminal of the integrated circuit, the second terminal coupled between the communication bus and the communication interface; causing a reset signal to be in a first state of the reset signal when the first signal is in a first state of the first signal; causing the reset signal to be in the first state of the reset signal when a second signal is in a first state of the second signal; causing the reset signal to be in a second state of the reset signal when the first signal is in a second state of the first signal for at least a first duration and the second signal is in a second state of the second signal, where the first state of the first signal is opposite the second state of the first signal, where the first state of the second signal is opposite the second state of the second signal, and where the first state of the reset signal is opposite the second state of the reset signal; and resetting the integrated circuit to a known state when the reset signal is in the third state.

EXAMPLE 22

The method of example 2, where the first state of the first signal is high, the second state of the first signal is low, the first state of the second signal is high, the second state of the second signal is low, the first state of the reset signal is high, and the second state of the reset signal is low.

EXAMPLE 23

The method of one of examples 21 or 22, where the communication bus is a serial peripheral interface (SPI) communication, and where the communication interface is an SPI interface.

EXAMPLE 24

The method of one of examples 21 to 23, where the first signal is a periodic signal, and where the first duration is equal to or longer than half a period of the periodic signal.

While this invention has been described with reference to illustrative embodiments, this description is not intended to be construed in a limiting sense. Various modifications and combinations of the illustrative embodiments, as well as other embodiments of the invention, will be apparent to persons skilled in the art upon reference to the description. It is therefore intended that the appended claims encompass any such modifications or embodiments.

What is claimed is:

1. An integrated circuit comprising:
a communication interface configured to be coupled to a communication bus, the communication interface having a plurality of terminals; and
an input circuit having a first input coupled to a first terminal of the plurality of terminals, and a second input coupled to a second terminal of the plurality of terminals, the first input of the input circuit configured to receive a first signal and the second input of the input circuit configured to receive a second signal, wherein the second signal is a data signal, wherein the first signal is a clock signal or a communication interface selection signal to selectively cause a processing of the data signal by the communication interface, and wherein the input circuit is configured to generate a reset signal at an output of the input circuit based on the first and second signals while the communication interface is unselected, wherein the input circuit is configured to:
cause the reset signal to be in a first state of the reset signal when the first signal is in a first state of the first signal,
cause the reset signal to be in the first state of the reset signal when the second signal is in a first state of the second signal, and
cause the reset signal to be in a second state of the reset signal when the first signal is in a second state of the first signal for at least a first duration and the second signal is in a second state of the second signal, wherein the first state of the first signal is opposite the second state of the first signal, wherein the first state of the second signal is opposite the second state of the second signal, and wherein the first state of the reset signal is opposite the second state of the reset signal.

2. The integrated circuit of claim 1, wherein the first state of the first signal is high, the second state of the first signal is low, the first state of the second signal is high, the second state of the second signal is low, the first state of the reset signal is high, and the second state of the reset signal is low.

3. The integrated circuit of claim 1, wherein the input circuit comprises:
a delay circuit having an input coupled to the first input of the input circuit;
an AND gate having a first input coupled to an output of the delay circuit and a second input coupled to the first input of the input circuit;
an inverter having an input coupled to the second input of the input circuit; and
a NAND gate having a first input coupled to an output of the AND gate, a second input coupled to an output of the inverter, and an output coupled to the output of the input circuit.

4. The integrated circuit of claim 1, wherein the first duration is longer than 4 ns.

5. The integrated circuit of claim 4, wherein the first duration is about 10 ns.

6. The integrated circuit of claim 1, wherein the communication interface is configured to be selectable based on the first signal.

7. The integrated circuit of claim 6, wherein the communication interface is configured to:
be selected when the first signal is low; and
not be selected when the first signal is high.

8. The integrated circuit of claim 1, wherein the communication interface is a serial peripheral interface (SPI) interface.

9. The integrated circuit of claim 8, wherein the SPI interface is a single SPI interface having a chip select terminal, a master-in-slave-out terminal, a master-out-slave-in terminal and an SPI clock terminal, and wherein the first input of the input circuit is coupled to the chip select terminal and the second input of the input circuit is coupled to the master out slave in terminal.

10. The integrated circuit of claim 8, wherein the SPI interface is a multi-IO SPI interface having a chip select terminal, an SPI clock terminal, and a plurality of input output terminals and wherein the first input of the input circuit is coupled to the chip select terminal and the second input of the input circuit is coupled to one of the plurality of input output terminals.

11. The integrated circuit of claim 1, wherein the communication interface is a serial wire debug (SWD) interface.

12. The integrated circuit of claim 11, wherein the first input of the input circuit is coupled to an input clock terminal of the SWD interface and the second input of the input circuit is coupled to data in and out terminal of the SWD interface.

13. The integrated circuit of claim 1, wherein the first signal is a clock signal, and wherein the input circuit comprises a delay circuit coupled to the first input of the input circuit, the delay circuit configured to generate a delay equal to or higher than half a period of the clock signal.

14. An integrated circuit comprising:
a serial peripheral interface (SPI) interface configured to be coupled to an SPI communication bus, the SPI interface having an SPI clock terminal, an SPI chip select terminal and a plurality of data terminals; and
an input circuit having a first input coupled to the SPI chip select terminal, and a second input coupled to one of the plurality of data terminals, the first input of the input circuit configured to receive a first signal and the second input of the input circuit configured to receive a second signal, wherein the input circuit is configured to generate a reset signal at an output of the input circuit based on the first and second signals while the SPI interface is inactive, wherein the input circuit is configured to:
cause the reset signal to be in a first state of the reset signal when the first signal is in a first state of the first signal,
cause the reset signal to be in the first state of the reset signal when a second signal is in a first state of the second signal, and
cause the reset signal to be in a second state of the reset signal when the first signal is in a second state of the first signal for at least a first duration and the second signal is in a second state of the second signal, wherein the first state of the first signal is opposite the second state of the first signal, wherein the first state of the second signal is opposite the second state of the second signal, and wherein the first state of the reset signal is opposite the second state of the reset signal.

15. The integrated circuit of claim 14, wherein the first state of the first signal is high, the second state of the first signal is low, the first state of the second signal is high, the second state of the second signal is low, the first state of the reset signal is high, and the second state of the reset signal is low.

16. The integrated circuit of claim 14, wherein the input circuit comprises:
a delay circuit having an input coupled to the first input of the input circuit;
an AND gate having a first input coupled to an output of the delay circuit and a second input coupled to the first input of the input circuit;
an inverter having an input coupled to the second input of the input circuit;
and a NAND gate having a first input coupled to an output of the AND gate, a second input coupled to an output of the inverter, and an output coupled to the output of the input circuit.

17. The integrated circuit of claim 14, wherein the SPI interface comprises a single SPI interface.

18. The integrated circuit of claim 14, wherein the SPI interface is a quad SPI interface.

19. A method of resetting an integrated circuit, the method comprising:
receiving a first signal via a first terminal of the integrated circuit, the first terminal coupled between a communication bus and a communication interface;
receiving a second signal via a second terminal of the integrated circuit, the second terminal coupled between the communication bus and the communication interface, wherein the second signal is a data signal, wherein the first signal is a clock signal or a communication interface selection signal to selectively cause a processing of the data signal by the communication interface;
causing a reset signal to be in a first state of the reset signal when the first signal is in a first state of the first signal;
causing the reset signal to be in the first state of the reset signal when the second signal is in a first state of the second signal;
causing the reset signal to be in a second state of the reset signal when the first signal is in a second state of the first signal for at least a first duration, the second signal is in a second state of the second signal, and the communication interface is unselected, wherein the first state of the first signal is opposite the second state of the first signal, wherein the first state of the second signal is opposite the second state of the second signal, and wherein the first state of the reset signal is opposite the second state of the reset signal; and
resetting the integrated circuit to a known state when the reset signal is in the second state.

20. The method of claim 19, wherein the first state of the first signal is high, the second state of the first signal is low, the first state of the second signal is high, the second state of the second signal is low, the first state of the reset signal is high, and the second state of the reset signal is low.

21. The method of claim 19, wherein the communication bus is a serial peripheral interface (SPI) communication, and wherein the communication interface is an SPI interface.

22. The method of claim 19, wherein the first signal is a periodic signal, and wherein the first duration is equal to or longer than half a period of the periodic signal.

* * * * *